United States Patent [19]

Wang et al.

[11] Patent Number: 4,734,583
[45] Date of Patent: Mar. 29, 1988

[54] READOUT CIRCUIT FOR DUAL-GATE CID IMAGERS WITH CHARGE SHARING CORRECTED FOR SUBTRACTIVE ERROR

[75] Inventors: Samuel C. Wang, Manlius; Michael L. Winn, Liverpool; Martin D. Gibbons, Camillus; Gordon H. Danielson, Syracuse, all of N.Y.

[73] Assignee: General Electric Company, Syracuse, N.Y.

[21] Appl. No.: 919,464

[22] Filed: Oct. 16, 1986

[51] Int. Cl.$^4$ .............................................. H01L 31/00
[52] U.S. Cl. ................................... 250/332; 250/578; 358/113
[58] Field of Search ........ 250/370 G, 370 R, 338 SE, 250/332, 349, 578; 358/113, 213.31, 213.29, 213.27, 213.11, 213.15, 213.16

[56] References Cited

U.S. PATENT DOCUMENTS

| | | | |
|---|---|---|---|
| 4,316,221 | 2/1982 | Swab | 358/213.16 |
| 4,399,464 | 8/1983 | Hix et al. | 358/113 |
| 4,652,766 | 3/1987 | Wang et al. | 250/370 G |

Primary Examiner—Carolyn E. Fields
Assistant Examiner—John A. Miller
Attorney, Agent, or Firm—Richard V. Lang; Carl W. Baker; Fred Jacob

[57] ABSTRACT

A readout circuit for IR sensing charge injection devices (CID) is disclosed, the CID comprising a two-dimensional array of dual-gate sensing sites on an InSb or HgCdTe substrate. The novel readout circuit, which operates in the charge sharing mode (CSM) in extracting image information, is modified to correct for the subtractive effect present when the CSM mode is used. The readout circuit includes a plurality of processors, one for each column, from which a single serial output may be obtained by a demultiplexer, and into which signals derived from successive pixel sites on the associated column are coupled. A first quantity representing the subtractive error is obtained without injection from each column line by double sampling during a first interval. A second quantity representing the signal corrected for subtractive error is obtained with injection from a pixel site by double sampling during a second interval, the samples being increased by the error quantity. The subtractive error compensation may be applied in cases involving either unsaturated or saturated signal fields.

7 Claims, 8 Drawing Figures

FIG. 2 COLUMN VIDEO PROCESSOR (CVP)

A1: OPERATIONAL AMPLIFIER WITH GAIN
A2, A3, A4: UNIT GAIN BUFFER AMPLIFIER

READOUT CIRCUIT FOR DUAL-GATE CID IMAGERS WITH CHARGE SHARING CORRECTED FOR SUBTRACTIVE ERROR

BACKGROUND OF THE INVENTION

1. Field of the Invention

The invention relates to charge injection devices (CID) for sensing IR image intensity information obtained from a two dimensional array of dual-gate sensing sites on an InSb or HgCdTe substrate, and more particularly to a novel readout circuit which while operating in the charge sharing mode (CSM) in extracting image information, provides correction of the subtractive or photocurrent effect present when the CSM mode is used.

2. Prior Art

Dual-gate charge-injection devices are solid-state self-scanned focal plane mosaics that employ surface charge transfer/injection to achieve full X-Y address capability for area arrays. The charge transfer takes place between the row and column sites (and vice versa) at a dual-gate site. The injection represents the injection of charge into the substrate from the dual-gate site accompanied by a flow of charge at the input of the preamplifier of the readout circuit. Sensor arrays of this design offer great flexibility because of the inherently simple structure. The design facilitates on-site noise-free signal integration and kTC and 1/f noise suppression when read out using correlated double sampling (CDS).

Recent progress in InSb metal-insulator-semiconductor (MIS) processing and CID readout technology has led to 128×128 infrared sensor arrays accompanied by Si metal-oxide-semiconductor (MOS) scanner/preamplifiers (2) constituting the readout circuitry.

The success of the visible Si CID two dimensional sensor array is due to the mature Si MIS technology. In other semiconductors such as InSb, however, the dielectric process is not yet well developed. Dual-gate CID area arrays require good charge transfer. The existence of states or traps at the oxide semiconductor interface severely inhibits rapid charge transfer. As a consequence, the major technical difficulty in the implementation of large infrared CID area arrays has been the charge transfer inefficiency. To achieve better charge transfer, the arrays are often operated with a bias charge in the potential well. The bias charge in this readout scheme, known as the charge sharing mode (CSM), serves to keep the interface states or traps filled. Unfortunately, the signal charge in the CSM is shared by the dual-potential wells of the coupled gates and consequently can not be read out completely. This uniform loss in signal represents a degradation in readout efficiency. Furthermore, the continuous charge integration that takes place in the sites interferes with the CID readout process, resulting in a "subtractive effect". The subtractive effect reduces the signal on an intra-column basis and introduces artifacts dependent on the signal strength experienced by the elements in the column.

SUMMARY OF THE INVENTION

Accordingly, it is an object of the present invention to provide an improved readout circuit in a two dimensional IR sensing array.

It is another object of the present invention to provide in a two dimensional IR sensing array, a readout circuit operating in the charge sharing mode in which the subtractive effect is corrected.

These and other objects of the invention are achieved in an IR sensitive charge injection device (CID) comprising an IR sensing array and a novel readout circuit.

The array comprises a substrate of IR sensitive semiconductor material supporting an interfacing layer of insulating material and on which m rows by n columns of pixel sites forming charge storing potential wells are arranged, each site having a conductive row gate and a conductive column gate. The charges at a site are free to flow at the interface between the column gate and row gate in the presence of a bias potential, and the row gates for each row of sites are interconnected by a conductive row line and the column gates for each column of sites are interconnected by a conductive column line.

The readout circuit comprises means including a source (VRB) of row bias potentials and m controllable row bias reset switches ($RS_{1-m}$), for establishing charge storing potential wells at the row gate cells and for facilitating charge exchange between column and row gates at a site; a source (VRT) of row transfer potentials and m controllable row transfer switches ($TS_{1-m}$) for injecting signal charge into the substrate and transfering charge via the column line during readout; and a shift register (SR) with complementary outputs coupled to the transfer switches and to the row bias reset switches for sequentially connecting a respective (ith) single row line to the source (VRT) and disconnecting the (ith) single row line from the source (VRB), the non (ith) row lines remaining connected to the source (VRB).

In addition, n column video processors are provided each comprising means operable over a first interval without injection for each pixel to sample and hold a first electrical quantity dependent on the change in IR induced charge in the column line, the first quantity representing subtractive error, and means operable during a second interval, equal to the first interval, with injection for each pixel to sample and hold a second electrical quantity dependent on the IR induced charge accumulated over the integration time and increased by the first quantity to correct for subtractive error.

In a first embodiment adapted for operation with non-saturating IR sources the subtractive error is obtained during the first interval without injection prior to the readout of the first pixel site of each column, each subtractive error being used to correct the second electrical quantity for every pixel site in the same column. In this embodiment the readout of the first pixel site in a column requires a first and a second interval, but all subsequent sites require only a second interval. In this embodiment the total time for scanning the array is substantially unaffected.

In a second embodiment adapted for operation with saturating IR sources the subtractive error is obtained during the first interval without injection for each pixel site of each column, and used to correct the second electrical quantity for the same pixel site. In this embodiment, the readout of each pixel site in a column requires a first and a second interval and the total time for scanning the array may be doubled.

BRIEF DESCRIPTION OF THE DRAWINGS

The inventive and distinctive features of the invention are set forth in the claims of the present application. The invention itself, however, together with further objects and advantages thereof may best be understood by reference to the following description and accompanying drawings, in which:

DESCRIPTION OF THE PREFERRED EMBODIMENT

Figure 1:
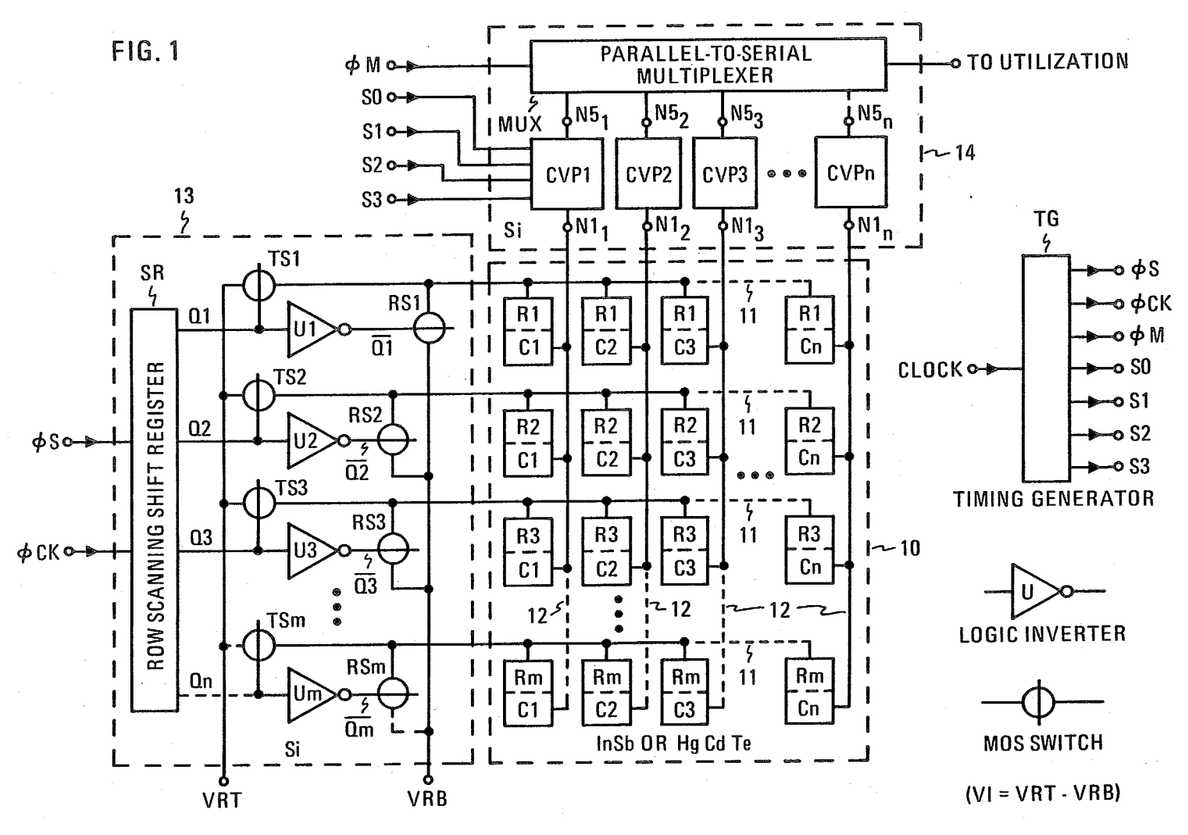
FIG. 1 is a circuit diagram of an IR sensing charge injection device (CID) comprising a two dimensional array of dual gate sensing sites on an InSb or HgCdTe substrate (or Si is used in a charge sharing mode) and a novel charge sharing mode (CSM) readout circuit in which the subtractive effect is corrected.

Referring now to FIG. 1, a charge injection device (CID) for infrared (IR) imaging is shown. The CID comprises an IR area sensor array of dual gate charge storage sites combined with a novel readout circuit. In the novel readout circuit, the subtractive error present during the charge sharing mode (CSM) of operation is corrected.

The sensor array 10 comprises a substrate of IR sensitive semiconductor material, typically Indium antimonide (InSb) or mercury cadmium telluride (HgCdTe) supporting a layer of insulating material typically silicon dioxide ($SiO_2$) or zinc sulfide (ZnS). A conductive row gate and a conductive column gate are coupled to form a pixel site, each gate defining a capacitive cell including the underlying portions of the insulating layer and of the semiconductor substrate. In the FIG. 1 illustration, the array consists of m rows and n columns of dual gate sites. Each site thus defines a common region consisting of two contiguous capacitive cells in which optically induced electronhole pairs may be created by photons, and between and within which the charges are free to move. Customarily, the charges accumulate at the interface between the insulating material and the semiconductor material, and flow freely from the column cell to the row cell and vice versa, normally under the influence of voltages applied to the row and column gates. All the row gates in one line are interconnected by a conductive row line 11, and all the column gates in one column are interconnected by a conductive column line 12. Accordingly, m row lines and n column lines are provided for connection of the arrow to the readout circuit.

The readout circuit shown in FIG. 1 may be partitioned into three means (13, 14 and TG). The first means, 13, for row injection is connected to the row lines 11 of the sensor array. The second means 14 derives parallel information from each column line (12), and as each row is selected for injection, combines the parallel streams of column data into a single serial stream representing the line output of the full sensor array. The third means (TG) times the operation of the CID including the means 13 and 14.

The row injection means 13, includes a source of row bias potentials (VRB) and m controllable row bias reset switches ($RS_{1-m}$); a source of row transfer potentials (VRT) and m controllable row transfer switches ($TS_{1-m}$); and a shift register (SR) having m outputs at each of which a control pulse ($Q_i$) appear for sequentially selecting single rows for injection in the readout process.

The connections of the sequential row selection means 13 are as follows. The row scanning shift register (SR), which controls row selection, is in turn controlled by the clock (phi CK) and the sequence starting pulse (phi S), which are supplied from the timing generator (TG), yet to be described. Each ith output ($Q_i$) of the (1—m) uninverted Q outputs of the shift register is connected to control a row transfer switch ($TS_i$). The inversion (Q-bar$_i$) of each output ($Q_i$) which may be provided either by a (Q-bar$_i$) output of the register or by an associated inverter ($U_i$) independent of the shift register, is connected to control an associated reset switch ($RS_i$). The source of row transfer potentials (VRT) is connected to a first terminal of all the row transfer switches ($TS_{1-m}$). The second terminal of each row transfer switch ($TS_i$) is connected to the corresponding ith row of the array 10.

The source of row bias potential (VRB) is connected to a first terminal of all the row bias reset switches ($RS_{1-m}$). The second terminal of each reset switch ($RS_i$) is connected to the corresponding ith row of the array 10. In scanning the array, the row selection means 13 sequentially selcts the first elements in all the columns, the second elements in all the columns, and so forth, concluding with a selection all the mth (i.e. last) elements in all of the columns, after which the row selection cycle repeats.

The readout circuit further comprises n column video processors ($CVP_{1-n}$), each connected to a column line 12 for deriving parallel information as each row is selected and a parallel to serial multiplexer (MUX) for forming one or more serial data streams.

Figure 2:
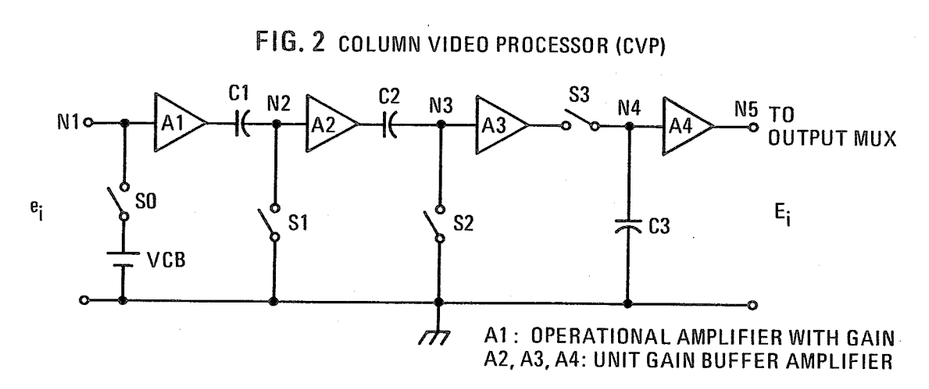
FIG. 2 is a circuit diagram of a column video processor, the output of which is provided to an output multiplexer for formation of a suitable display.

Each video processor ($CVP_j$) comprises four amplifiers ($A1_j$–$A4_j$), three capacitors ($C1_j$–$C3_j$), four switches ($S0_j$–$S03_j$), and a source of column bias potentials (VCB). Five nodes ($N1_j$, $N2_j$, $N3_j$, $N4_j$, $N5_j$), useful in circuit description, are present in the video processor: the node ($N1_j$) representing the input and the node ($N5_j$) representing the output, and the nodes ($N2_j$ and $N3_j$, $N4_j$) representing internal nodes. Each input node ($N1_j$) of the n column processors is coupled to a correspondingly numbered column (12) of the sensor array 10. Each output node ($N5_j$) of the n column processors is coupled to a correspondingly numbered input of the parallel to serial multiplexer.

The internal connections of each column video processor are as follows. The input node ($N1_j$) is connected to the input of gain amplifier ($A1_j$). The input node is also connected via the column bias reset switch ($S0_j$) and the source of column bias potential (VCB) to ground. The switch ($S0_j$) and source (VCB) act to reset the node ($N1_j$) to bias potential. The output of amplifier ($A1_j$) is connected via capacitor ($C1_j$) to the node ($N2_j$) at the input of a buffer amplifier ($A2_j$), typically of unitary gain. The node ($N2_j$) is connected to ground by the switch (S1$_j$) which in cooperation with the capacitor (C1$_j$) provides for dc referencing of the signal sample. The output of the amplifier (A2$_j$) is connected via the capacitor (C2$_j$) to the node (N3$_j$) at the input of the buffer amplifier (A3$_j$), also typically of unitary gain. The node N3$_j$ is connected to ground via the switch (S2$_j$) which in cooperation with the capacitor (C2$_j$) provides for subtractive error correction.

Continuing with a description of the column video processor, the output of the buffer amplifier (A3$_j$) is connected via the switch (S3$_j$) to the node (N4$_j$) at the input of the output buffer amplifier (A4$_j$), also typically of unitary gain. The capacitor (C3$_j$) is connected between the node (N4$_j$) and ground. Switch (S3$_j$) in combination with the capacitor (C3$_j$) provides for sampling and holding the signal, dc referenced, and corrected for subtractive error. The output of the buffer amplifier (A4$_j$) is then supplied to the jth parallel input of the parallel-to-serial multiplexer (MUX) where it is combined with the outputs of the other buffer amplifiers of the other column video processors to form a suitable signal for application to the display apparatus.

The readout circuit is completed by a timing generator (TG) which has outputs for timing the operation of the row scanning shift register (phi S and phi CK) and the output multiplexer (phi M), and the operation of the switches (S0, S1, S2, and S3) as well as the output MUX operation.

The readout circuit 13, 14 scans the InSb imager 10 in accordance with a method known as sequential row injection (SRI), which has been further modified as will be discussed below. The known SRI method together with certain limitations of that method are described in a paper entitled "Characteristics and Readout of an InSb CID Two Dimensional Scanning TDI Array" by Samuel Wang et al, appearing in the IEEE Transactions on Electron Devices, Vol. ED 32, #8, August 1985. The scanning of the imager in the present FIG. 1 embodiment generally follows the sequence of site selection described in FIG. 9 of U.S. Pat. No. 4,316,221 of John Swab, filed Aug. 5, 1980 and entitled "Apparatus for Sequential Row Injection Readout of CID Imagers. The present embodiments depart from the known method in the derivation of the subtractive error correction and its application to the values obtained by reading out the signal from the individual pixels.

The scanning sequence of the first embodiment begins with the generation by the timing generator (TG) of a starting pulse (phi S) coupled to the shift register SR). The starting pulse initializes the shift register which starts the count by selecting the row one sites for readout. The shift register then proceeds to count in sequence until the final row (m) is selected and read out.

It is of course essential that all sites on the array under the row and column gates be maintained at a suitable state to integrate photon induced charges as the scanning proceeds. This requirement must be maintained consistently with the transfer of charge that occurs from row to column gates, and with the injection of charge into the substrate which occurs when the site is read out.

Every site on the array under a row gate is held at the row bias potential (VRB) except when the row has been selected for readout. When the row is selected, the row bias is released, injection is applied via row transfer voltage (VRT), VI=VRT−VRB, and then the row bias is reapplied. Maintaining a constant integrating bias voltage on the MIS (metal-insulator-semiconductor) sites sustains the integration of optically induced charges by maintaining the depth of the potential well under the row gates. The bias charge serves to keep the interface states and traps filled to avoid the inhibiting effect on rapid charge transfer between row and column gates.

Figure 3A:
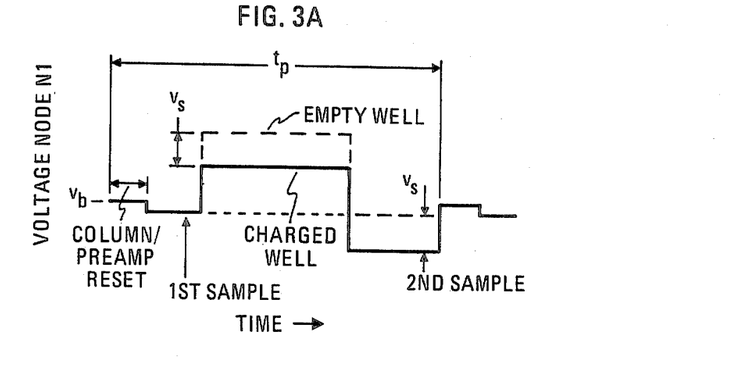
FIGS. 3A, 3B and 3C illustrate waveforms in the readout of a single site, FIG. 3A illustrating readout corresponding to an "Ideal Mode" in which the subtractive effect is not present, FIG. 3B illustrating the waveforms when the subtractive effect due to charge sharing is present, and FIG. 3C illustrating conditions when charge sharing is present and the resulting subtractive effect is corrected.
Figure 3B:
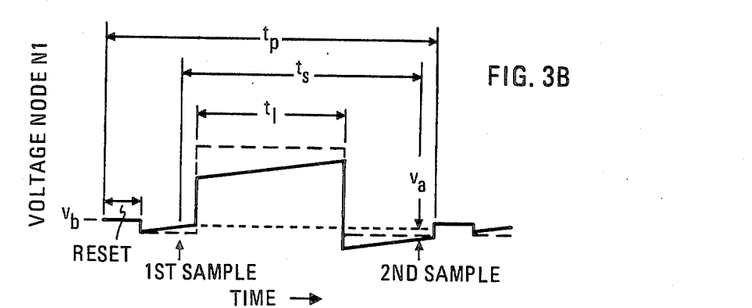
Figure 3C:
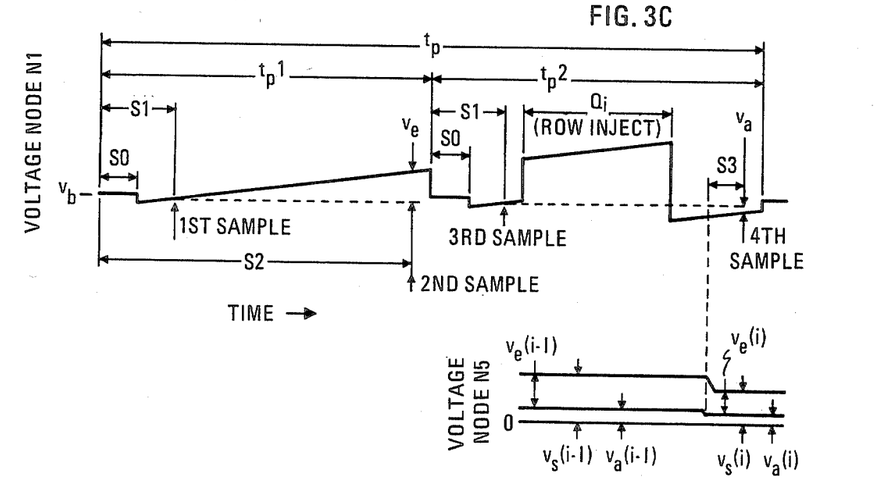
Figure 4:
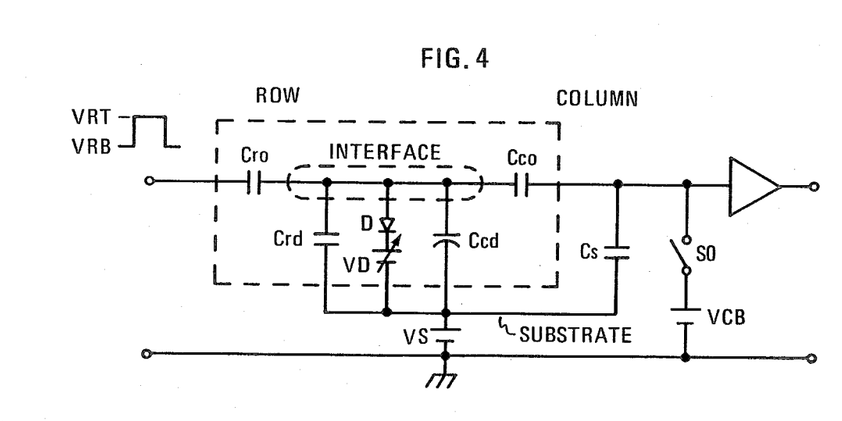
FIG. 4 is an illustration showing the equivalent circuit of a site in explanation of the dual-gate charge injection process.
Figure 5:
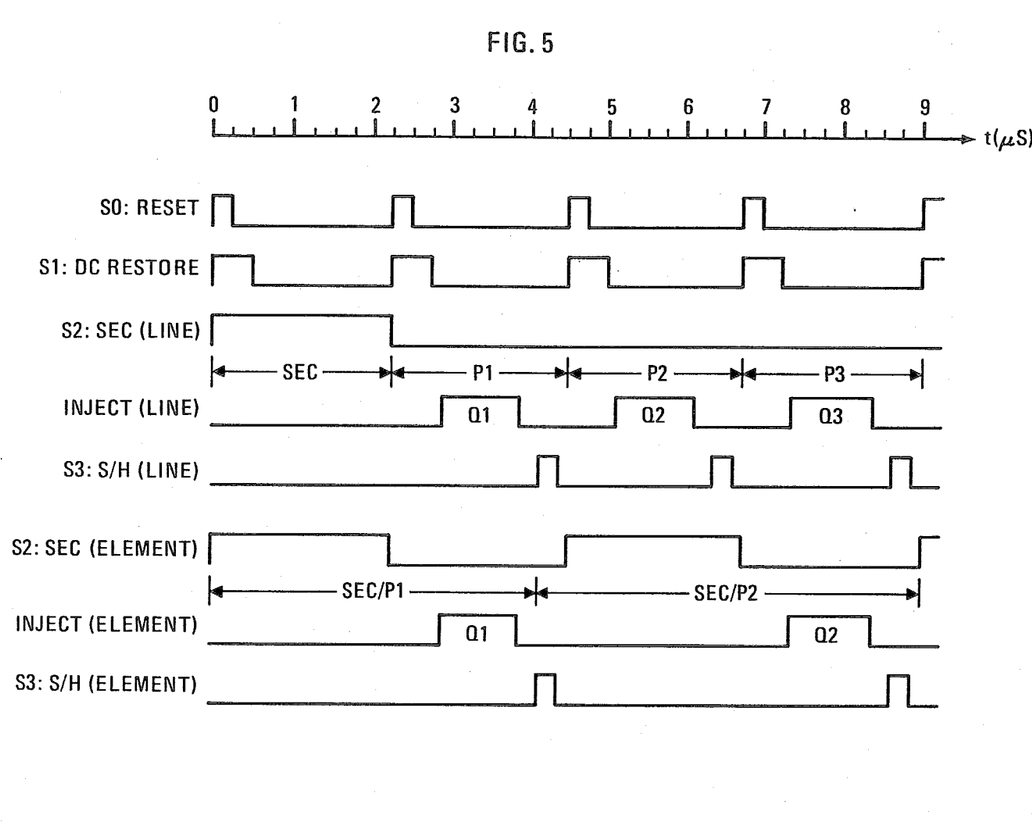
FIG. 5 is an illustration of the waveform useful in subtractive error correction, in both line by line correction and element by element correction.

Similarly at every site on the array under a column gate, a column bias potential is recurrently applied for the same purposes. The column bias is applied at least at the pixel rate (once or twice every pixel readout time, tp) as shown in FIGS. 3 and 5. The column bias is portrayed by the uppermost timing waveform, which takes the form of a short duration pulse (S0). The column bias reset pulse occurs on all column sites, whether being read out or not, and this maintains the potential well essential to charge integration under the column gates.

Returning now to a description of the scanning of the array, the shift register thus scans the rows 1−m, with the start being controlled by the (phi S) waveform from the timing generator. The counting rate is clocked by the waveform (phi CK) of the timing generator. When the mth (and last) row of sites has been selected, a new starting pulse (phi S) is generated and the shift register starts the scanning sequence over again.

The shift register in selecting the ith row of sites controls the switch (TS$_i$) without inversion and the switch (RS$_i$) via the inverter (U$_i$) which insures that the switches assume opposite states. The switches in turn control the application of the transfer voltage source (VRT) and the row bias voltage source (VRB) to the ith row sites. Accordingly, when a row of sites is selected for injection by the shift register, the reset bias voltage (VRB) is removed from all ith row sites and the injection voltage is applied via (VRT) to all ith row sites. After injection, the ith row is returned to the row bias voltage and so remains until selection by the shift register reoccurs.

The readout occurs one site at a time, all sites in the same row (but different columns) being read out before proceeding to the succeeding row. As previously explained, a single row of sites is selected for injection by the shift register (SR). The column selection of a site is achieved via the n fold plurality of column video processors (CVP$_{1-n}$) and the parallel-to-serial multiplexer (MUX) to which they are connected. Each video processor, after the signal has been obtained, holds the signal at the output nodes (N5$_{1-n}$) for readout by an input of the parallel-to-serial multiplexer. The multiplexer (MUX) then scans the n-fold columns at a sufficiently high rate to obtain signals from all the columns before a new row is selected by the shift register. The method obtains only refreshed site readings for eventual utilization.

Readout, according to the method described in U.S. Pat. No. 4,316,221, entails the taking of a double sample—"correlated double sampling"—from a site at a selected row and column. The known sampling process is illustrated in FIG. 3A. The first sample is taken following the reset pulse and pausing for a short period after the reset pulse to allow the voltage at the site to stabilize. An injection pulse is next applied for injecting the charges stored at the site into the substrate and thereby emptying the well. The second sample is taken shortly after injection, pausing again for a short period to allow the voltage at the site to stabilize. The second reading represents a difference between the initial and final states and is held for acquisition by the multiplexer.

The time required for reading out a pixel is typically from two to four microseconds.

The method of row and column site selection, has so far been not so detailed as to be inconsistant with the assumption that readout is performed by the taking of two samples, one before and the other after injection as depicted in FIG. 3A. Thus, each pixel interval in the FIG. 3A readout process begins as column bias is removed, continues through the injection pulse, through the pause for taking a reading, and is terminated with the reapplication of the column bias. The multiplexer, in a column scanning process, selects a signal held at the output of each column video processor. The scanning of all columns is accordingly performed once for each row selection.

The FIG. 3A sampling process is in fact idealized, as earlier suggested. During the typical 2-4 microseconds period that the sample is being taken, granted that a signal is present on the column gates, the integration of photon induced charges continues. In fact the upward slope of the voltage on the column may be due to charge generation in several forms, including dark current, leakage, and background as well as signal irradiation (which will normally predominate).

The charge integration process proceeds throughout the period between the taking of the two samples in a sense to lessen the voltage change measured and to lessen the signal indication.

The subtractive error resulting from charge integration is illustrated in FIG. 3B. The first sample is taken at a somewhat higher value than the minimum voltage following column (column video processor input) reset due to integration over the short period required for the line to stabilize following reset. During the injection pulse (applied to only a single site for each column), the voltage on the column node is observed to increase (as illustrated), indicating that charge integration is continuing on the unselected sites in the column. After injection, the charge integration continues until the second sample is taken. The observed signal (Va) in FIG. 3B, which is equal to the difference between voltages at the two sampling times, is substantially less than in the idealized case depicted in FIG. 3A where subtractive error is assumed to be absent.

The subtractive error results from charge integration over the full time period ($t_s$) between the taking of the first and the second samples. The subtractive error could of course be reduced if $t_s$ could be reduced. However, the separation between sampling times is set by the injection time and the settling times of the column video processor and is already of minimal duration consistent with other circuit limitations.

Analysis shows that the voltage at the column video processor input node ($N1_j$) is $$\text{delta } V = it_s/C_s \quad (1)$$

where
 i = the induced current due to net charge generation in the potential wells
 $t_s$ = time interval between samples
 $C_s$ = total shunt capacitance on the selected (CVP) node ($N1_j$).

Since an m×n array has m MIS sites (e.g. 128) connected in parallel to the common column metal run, the subtractive error is due to the cumulative charge integration from a large number (m) of contributing sites.

From a circuit viewpoint, the subtractive error is caused by invalid dc restoration in the CID readout process. The error is the difference between the "true" non-offset first sample and the "actual" or offset first sample.

Quantitatively, the error voltage ($v_{ek}$) for the readout of pixel k depends on the number of contributing pixels on the column (up to m), the integration time ($t_I \approx m\, t_p$), the time interval between the two samples of CDS ($t_s$), and the injection pulse duration ($\tau_I$) as shown in FIGS. 3A and 3B. That is, $$V_{ek} = \sum_{\substack{i=1 \\ i \neq k}}^{m} m_{ik}(t_s/t_I)V_{si} + [(t_s - \tau_I)/t_I]V_{sk} \quad (2)$$

where $$V_{si} = \eta H_{si} T_I A_d / C_s \quad (3)$$

is the signal voltage from pixel i (i=1, 2, ... m) in the absence of the subtractive effect, assuming that the irradiance $H_{si}$ (photon/sec/cm²) on pixel i does not change appreciably during the integration time. Eta ($\eta$) and $A_d$ are detector quantum efficiency and pixel detecting area, respectively. The parameter $m_{ik}$ reflects the status of the subtractive effect from contributing pixels and can be expressed as $$m_{ik} = \begin{cases} 1, & \text{if pixel } i \text{ is not saturated at the moment pixel } k \text{ is being read out.} \\ 0, & \text{if pixel } i \text{ has reached saturation.} \end{cases} \quad (4)$$

The first summation term in Eq. (2) accounts for the effect from pixels in the column other than the one undergoing readout. The last term represents the effect from the pixel being read right after the injection pulse. Eq. (3) defines the would-be signal voltage if it is not limited by the detector charge storage capacity. The apparent signal from pixel k can then be expressed as $$v_{ak} = v_{sk} - v_{ek} \quad (5)$$

provided $v_{sk}$, as given by Eq. (3), does not exceed the detector saturation signal $v_{ss}$, which is determined by the storage capacity (defined by the pixel gate oxide capacitance and injection voltage). In the case of a saturated pixel k, the apparent signal is given by $$v_{ak} = v_{ss} - v_{ek} \quad (6)$$

The last term of Eq. (2) due to post-inject charge integration in the pixel undergoing readout is usually negligible unless the irradiance is several times the saturation level. The first summation term in Eq. (2), however, is a severe signal loss, especially in a large array (i.e., large m), and is corrected by the measures about to be explained.

The effect of subtractive error, illustrated in relation to a single pixel in FIG. 3B, may be corrected in the total array in one of two ways depending upon the signal strength. The signal field may be considered to fall into three general categories.

If the signal field is of uniform intensity as by flooding (as opposed to imaging), and of insufficient intensity to produce saturation there is a constant reduction in signal over the field due to the subtractive error. This is not a practical case and need not be further considered.

It could be corrected by a dc adjustment of the entire display.

In a second (and practical) case, the signal field is of non-uniform intensity, but of insufficient intensity to produce saturation in any of the pixels. In this case, the subtractive error may be computed for the pixels associated with each column and a constant error for each column may be derived from a non-inject readout and reused as the pixels in the column are scanned. This case allows for a relatively simple correction which may be applied without decreasing the scanning rate. This correction is effected by a first embodiment of the invention.

Figure 6:
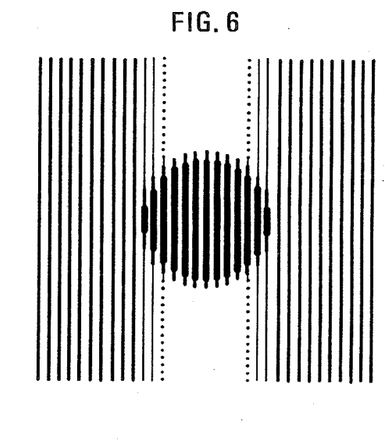
FIG. 6 is an illustration of the subtractive effect upon the background when a bright non-saturating source is present.

A practical illustration of the second case is provided in FIG. 6. Here a bright but non-saturating localized IR source superimposed on a low level but uniform background is illustrated. On sites with low level illumination along columns where the bright IR source is present, the readout signal is suppressed. FIG. 6 shows the effect of a circular focal spot imaged upon a 32×32 array comparable to the arrays herein described. The subtractive error in the readout signal from the pixels in the focal spot columns is proportional to the number of brightly illuminated pixels in the corresponding column. This is consistent with the general formula of Eq. (2). The subtractive error, as shown in the photograph, extinguishes the readout signals present in the low level pixels at the columns intercepting the central portion of the focal bright spot, and reduces but does not extinguish the readout signals present in the low level pixels at the columns intercepting the outer portions of the focal bright spot. Other tests have shown that the subtractive error in the output reading is uniform along the column so long as the individual bright pixels are not saturated.

In a third (and practical) case, the signal field is of non-uniform intensity, but of sufficient intensity to produce saturation in some of the pixels. In this case, the subtractive error may be computed for each pixel and applied to correct the readout signal for that pixel. This correction requires a first non-inject readout for each pixel to obtain the subtractive error and a second injected readout for each pixel to obtain the readout signal containing the correction. This correction requires primarily changes in timing of the apparatus employed in the first embodiment.

In accordance with both embodiments of the invention, a quantity $V_e$ equal to the subtractive error voltage is derived, and added to the observed signal $V_a$ to obtain a signal more nearly equal to the true signal $V_s$.

The subtractive error correction circuit is contained in each of the column video processors whose circuits are as illustrated in FIG. 2. The operation of the CVPs in obtaining a subtractive error voltage is illustrated in FIG. 3C. The timing waveforms essential to operation of the column video processors in accordance with both the first and second embodiments of the invention are illustrated in FIG. 5.

The column video processors, whose circuits have been earlier described, operate to provide the subtractive error correction in accordance with either the first or second embodiment. Readout of the (i,j)th pixel involves an injection of the ith row by the shift register (SR) and a selection of the column video processor (CVP$_j$) by the multiplexer. The beginning of column reset (S0) defines the start of readout of the selected pixel. As will be seen, readout interval of a pixel (tp) requires two equal periods (tp1, tp2), the first period (tp1) to obtain the subtractive error and the second period (tp2) to obtain the output signal corrected for subtractive error.

At the beginning of the subtractive error correction period (tp1) for an (i,j)th pixel, the column node (N1$_j$) is reset to the column bias potential by the closure of (S0). The S0 reset waveform is the first waveform shown in FIG. 5. For illustration purpose, the timing of all waveforms is indicated by a microsecond scale at the top of the figure. Reset by switch (S0) of the column node N1 is shown at the left edge (but is also shown at the center and right edge) of FIG. 3C. Switch S0 in series with the column bias source (VCB) is closed for approximately 0.5 microseconds, which is long enough to effect reset of the node N1.

Switches S1 and S2 are also closed at the start of the period (tp1). Switch S1, which is controlled by the waveform S1 (DC restore) of FIG. 5, remains closed for approximately 0.5 microseconds after removal of reset, allowing capacitor C1 to charge to the post-reset value at node N1. When S1 opens, capacitor C1 has become charged to the appropriate amount for dc restoration of the subtractive error correction.

The dc restored subtractive error voltage accumulates during the period (tp1) as capacitor C2 charges from the column node N1 via switch S2. Switch S2 remains closed through the subtractive error correction period under the control of the third waveform in FIG. 5 marked SEC (Line) (for subtractive error correction, Line by Line). The closure of S2 during the SEC (Line) pulse allows capacitor C2 to charge from all the sites on the selected column at the rate the subtractive effect would have produced under conventional sampling with one row site being injected. The duration of the SEC waveform (tp1) is set equal to the pixel time (tp) of FIG. 3B set for signal sampling and the period between samples ($t_s$) are also equal. When switch S2 is opened, ending the SEC period, the charging path to C2 is broken and a charge reflecting the predicted subtractive error is trapped on the capacitor (C2).

The charge on capacitor C2 will now be applied to correct the signal obtained by correlated double sampling at node N5.

The taking of the signal samples after storage of the SEC error on capacitor C2 is straight forward. The two signal samples taken during (tp2) on the column node N1 respectively precede and follow injection.

The signal sampling period (tp2) starts with closure of switch S0 for 0.5 microseconds which connects the column node N1 to the column reset voltage VCB. Closure of switch S1 with switch S0 allows capacitor C1 to be charged to the column potential following reset for dc restoration. The opening of switch S1, which occurs at about 1 microsecond after the beginning of the period tp2, completes dc restoration, with C1 appropriately charged. The opening of switch S1 completes the taking of the "third" sample in the total pixel period (tp) (or the taking of the first signal sample in the period tp2), as shown in FIG. 3C.

Injection follows immediately after the taking of the first signal samples. The inject (Line) waveform Q1 (Q$_i$, i=1) of FIG. 5 closes switch TS$_i$, coupling the transfer voltage (VRT) to the selected ith row to cause injection. The voltage VRT applied to the row site of the (i,j)th pixel, by collapsing the potential well to the bias value causes a transfer of signal charge to the column site, resulting in a coupled injection waveform on node N1$_i$. Shortly after the injection pulse (Q$_i$), the waveform marked S3 S/H (Line) effects the closure of S3 corresponding to the taking and holding of the fourth sample in the period (tp) (or the second signal sample in the period tp2). The closure of switch S3 allows the charge representing the true signal ($V_{si}$) to be stored on the capacitor C3 and the opening of switch S3 traps the charge on capacitor C3. The amplifier A4 acts as a buffer to hold the stored charge at node N5 at a constant value during the time required for sampling by the multiplexer (MUX).

The secondary waveform, in FIG. 3C, placed below the principal waveform, shows the output waveform at the node N4, or N5. (The principal waveform is the voltage at node N1.) The quantities $V_e$ and $V_s$ on both waveforms indicate the values stored on the capacitors C2 and C3. The times for taking the four samples are shown on the principal waveform. The readings stored at node N5 from the prior (i−lth) sampling period are shown at the left hand portion of the secondary waveform. At the closure of S3, signal charge has been injected from the (i,j)th site emptying the potential well, and a new value reflecting the new signal is propagating via the buffer amplifier A1, A2, A3, switch S3 to the capacitor C3. After a settling period, the opening of switch S3 (just before the next reset pulse) effects the taking of the second signal sample.

The readout signal appears as $V_{s(i)}$, which may be seen to represent the sum of the error $V_{e(i)}$ and the apparent signal $V_{a(i)}$. The magnitude of $V_{s(i)}$ is substantially larger than $V_{a(i)}$, the uncorrected signal. The corrected signal represents both an improvement in sensitivity and in fidelity in the IR detection process.

The foregoing arrangement for subtractive error correction, characterized by the four initial waveforms of FIG. 5, is applicable to the case in which the sources of light are within the dynamic range of the sensor array, and thus do not saturate individual pixels. In the foregoing arrangement, the waveform S2 (SEC) Line is active once in a line time at the beginning of the column read cycle. The error message is therefore trapped in the capacitor C2 of each of the column video processors at the same time. The trapped value is maintained on capacitor C2 as the columns are sampled until all the rows are read out. The waveforms which effect this mode of correction are supplied by the timing generator and include S0, S1, S2, $Q_{1-m}$ (via the shift register SR) and S3. The timing scheme for a non-saturating field of view, since it does not require double time for any but the initial pixels, may complete the scanning of a single frame at the same rate as in the normal CID readout.

When saturation is present the subtractive error requires a pixel by pixel correction. When the field of view contains very bright IR sources, individual pixels may saturate. When a given pixel is saturated, there is no longer a growth in the photon induced charge in the pixel and no net growth in the charge on the column gates associated with that pixel. In the pixel adjoining the saturated pixel, the subtractive error may vary dynamically. The most accurate correction in such a case is to obtain a correction on an element for element basis as the row is scanned. The same column video processors may be used to implement the correction, with the only changes being in the waveforms provided by the timing generator (TG). In particular, the SEC waveform which controls switch S2 reoccurs at the pixel rate, allowing the subtractive error to be obtained for each pixel before it is read. In addition, inject waveform ($Q_i$) occurs in the second half period (tp2) of the pixel period (tp), and the taking of the third sample (S3), occurs shortly after the inject waveform at the end of the second half period. This approximately doubles the time that it takes to can the rows in a column and the line time for sequential readout is also doubled.

The correction in both the saturated and unsaturated cases is good, significantly improving the sensitivity of the imager. The temporal noise is also increased by a factor equal to the square root of two due to the operation of the switch S2 and the capacitor C2.

The invention has been characterized as applicable to InSb and HgCdTe substrate materials where the readout employs the charge sharing mode (CSM). The CSM mode may on occasion be of advantage when Si and other substrate materials are employed, in which the subtractive error will appear, and use of the correction herein described will substantially remove it.

The inventive embodiment herein described may be carried out using contemporary processing. The column video processors (14) of particular novelty interest, have been carried out using a CMOS process. The row selection circuitry (13) has been carried out using a single IC, one version using CMOS and another NMOS processing.

The column video processors require a high gain input stage (A1) having a charge to voltage gain of $4 \times 10^{12}$ volts/coulomb. The amplifiers A2, A3, A4 are source follower buffers with substantially unity gain. The capacitors $C_1$, $C_2$, and $C_3$ are nominally 2 picofarads.

What is claimed is:

1. In an IR sensitive charge injection device (CID), the combination comprising:
   (A) an array comprising a substrate of IR sensitive semiconductor material supporting an interfacing layer of insulating material and on which m rows by n columns of pixel sites forming charge storing potential wells are arranged, each site having a conductive row gate and a conductive column gate, the charges at a site being free to flow at the interface between the column gate and row gate in the presence of a bias potential, the row gates for each row of sites being interconnected by a conductive row line and the column gates for each column of sites being interconnected by a conductive column line,
   (B) a readout circuit comprising:
      (a) means including a source (VRB) of row bias potentials and m controllable row bias reset switches ($RS_{1-m}$), for establishing said charge storing potential wells at the row gates and for facilitating charge exchange between column and row gates at a site,
      (b) a source (VRT) of row transfer potentials and m controllable row transfer switches ($TS_{1-m}$) for injecting signal charge into the substrate and transfering charge via the column line during readout,
      (c) a shift register (SR) with complementary outputs coupled to said transfer switches and to said row bias reset switches for sequentially connecting a respective (ith), where i is a member of the series 1 to m, single row line to said source (VRT) and disconnecting said (ith) single row line from said source (VRB), the non (ith) row lines remaining connected to said source (VRB), each state thereof defining a pixel readout period, (d) n column video processors, each jth processor where j is a member of the series 1 to n, comprising:
  (1) a gain amplifier ($A1_j$) having the input thereof coupled to the (jth) column line at a first node ($N1_j$),
  (2) means including a source (VCB) of column bias potentials and a controllable column bias reset switch ($S0_j$), for applying a column bias potential (VCB) to said first node ($N1_j$) for establishing said charge storing potential wells at the column gates, and for facilitating charge exchange between column and row gates at a site,
  (3) means for dc restoration comprising a capacitor ($C1_j$) having one terminal coupled to the output of said gain amplifier, and the other to a second node ($N2_j$), and a switch ($S1_j$) having one terminal coupled to said second node ($N2_j$), and the other coupled to ground,
  (4) means for subtractive error correction comprising a capacitor ($C2_j$) having one terminal coupled to said second node ($N2_j$) and the other coupled to a third node ($N3_j$), and a switch ($S2_j$) having one terminal coupled to said third node ($N3_j$) and the other coupled to ground,
  (5) means for obtaining a signal sample comprising a capacitor ($C3_j$) having one terminal connected to ground and the other terminal providing the output terminal for said jth column video processor, and a switch ($S3_j$) having one terminal coupled to said third node ($N3_j$), and the other coupled to the column output terminal, and
(e) timing means including a timing generator for timing the operation of the scanning shift register ($Q_{1-m}$) and the switches, ($S0_{1-n}$ $S1_{1-n}$ $S2_{1-n}$ $S3_{1-n}$), the shift register $Q_i$ and switches $S0_j$, $S1_j$, $S2_j$, $S3_j$, effecting the readout of the site at the ith row jth column,
said timing means dividing the readout period for each pixel site into a half period for subtractive error correction and a half period for signal sampling,
said timing means momentarily closing ythe switches $S0_j$, $S1_j$ and $S2_j$ to begin subtractive error correction, said closings resetting nodes $N1_j$, $N2_j$ and $N3_j$ to said bias VCB, ground, and ground, respectively, then opening switch $S0_j$, then opening switch $S1_j$ after settling, to finish charging capacitor $C1_j$ for dc restoration and to begin charging capacitor $C2_j$, then opening switch $S2_j$ to finish charging capacitor $C2_j$ for subtractive error correction,
said timing means momentarily closing the switches $S0_j$ and $S1_j$ to begin signal sampling, said closings resetting nodes $N1_j$ and $N2_j$ to said bias VCB and ground, respectively, then opening switch $S0_j$, then opening switch $S1_j$ after setting to finish charging capacitor $C1_j$ for dc restoration, then closing the ith row transfer switch ($TS_i$) to inject signal charge into said substrate and to transfer charge to and from the column cells, then momentarily closing switch $S3_j$ to provide an output signal adjusted by the charge on capacitor $C1_j$ for dc restoration and by the charge on capacitor $C2_j$ for subtractive error correction.

2. In an IR sensitive charge injection device (CID), the combination comprising:
  (A) an array comprising a substrate of IR sensitive semiconductive material supporting an interfacing layer of insulating material and on which m rows by n columns of pixel sites forming charge storing potential wells are arranged, each site having a conductive row gate and a conductive column gate, the charges at a site being free to flow at the interface between the column gate and row gate in the presence of a bias potential, the row gates for each row of sites being interconnected by a conductive row line and the column gates for each column of sites being interconnected by a conductive column line,
  (B) a readout circuit comprising:
    (a) means including a source (VRB) of row bias potentials and m controllable row bias reset switches ($RS_{1-m}$), for establishing said charge storing potential wells at the row gates and for facilitating charge exchange between column and row gates at a site,
    (b) a source (VRT) of row transfer potentials and m controllable row transfer switches ($TS_{1-m}$) for injecting signal charge into the substrate and transfering charge via the column line during readout,
    (c) a shift register (SR) with complementary outputs coupled to said transfer switches and to said row bias reset switches for sequentially connecting a respective (ith), where i is a member of the series 1 to m, single row line to said source (VRT) and disconnecting said (ith) single row line from said source (VRB), the non (ith) row lines remaining connected to said source (VRB), each state thereof defining a pixel readout period,
    (d) n column video processors each comprising means operable over a first interval of the pixel readout period, without injection, for each pixel to sample and hold a first electrical quantity dependent on the change in IR induced charge in the column line, said first quantity representing subtractive error, and
  means operable during a second interval of the pixel readout period equal to said first interval, with injection, for each pixel to sample and hold a second electrical quantity dependent on the IR induced charge accumulated over the integration time measured from the last injection on the same pixel and increased by said first quantity to correct for subtractive error.

3. The combination set forth in claim 2 for operation with non-saturating Ir sources wherein:
  said means (d) obtains said subtractive error during said first interval without injection prior to the readout of the first pixel site (row) of each column, and applies each subtractive error to correct said second electrical quantity for each pixel site in the selected column, the readout of the first pixel site in a column requiring a first and a second interval, but all subsequent sites requiring only a second interval.

4. The combination set forth in claim 2 for operation with saturating IR sources wherein:
  said means (d) obtains said subtractive error during said first interval without injection for each pixel site of each column, and applies each subtractive error to correct said second electrical quantity for each pixel site, the readout of each pixel site in a column requiring a first and a second interval.

5. The combination set forth in claim 2 wherein said column video processors each includes a correlated double sampling circuit with subtractive error correction, each double sampling circuit comprising:
  (i) a timing means for timing operation of said correlated double sampling circuit during said first and second intervals,
  (ii) first sampling means responsive to said timing means including a first serially connected capacitor (C1) for obtaining a charge from the associated column line during reset and for storing a reference value at the beginning of a correction interval and at the beginning of a signal sampling interval,
  (iii) means for obtaining a subtractive error correction during said first interval comprising a second serially connected capacitor (C2), serially connected to said first sampling means for reference to said reference value storing said subtractive error correction upon completion of said correction interval, and
  (iv) a second sampling means responsive to said timing means serially connected to said subtractive error storing capacitor (C2) comprising a serially connected switch (S3) and a parallelly connected third capacitor (C3),
said timing means initiating said signal sampling interval during reset of said associated column line to obtain and store a reference value on said first capacitor (C1), then providing injection, said timing means terminating said signal sampling interval by momentarily closing said switch (S3) to admit said injected charge adjusted by the charge on capacitors (C1 and C2) for storage on said third capacitor (C3), to obtain a value representing a correlated double sample of the injected charge correlated with the first sample and corrected for subtractive error.

6. The combination set forth in claim 5 for operation with non-saturating IR sources wherein:
said first sampling obtains said subtractive error during said first interval without injection prior to the readout of the first pixel site of each column, and applies each subtractive error to correct said second electrical quantity for each pixel site in the selected column, the readout of the first pixel site in a column requiring a first and a second interval, but all subsequent sites requiring only a second interval.

7. The combination set forth in claim 5 for operation with saturating IR sources wherein:
said first sampling means obtains said subtractive error during said first interval without injection for each pixel site of each column, and applies each subtractive error to correct said second electrical quantity for each pixel site, the readout of each pixel site in a column requiring a first and a second interval.

* * * * *